United States Patent
Lee et al.

(10) Patent No.: US 7,396,751 B2
(45) Date of Patent: Jul. 8, 2008

(54) METHOD FOR MANUFACTURING SEMICONDUCTOR DEVICE

(75) Inventors: Ki Lyoung Lee, Hwaseong-si (KR); Keun Do Ban, Yongin-si (KR); Sa Ro Han Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,692

(22) Filed: Dec. 28, 2006

(65) Prior Publication Data

US 2007/0161221 A1  Jul. 12, 2007

(30) Foreign Application Priority Data

Jan. 6, 2006  (KR) ...................... 10-2006-0001788

(51) Int. Cl.
*H01L 21/44* (2006.01)
*H01L 21/3205* (2006.01)
*H01L 21/28* (2006.01)

(52) U.S. Cl. ........................ 438/597; 438/598; 438/605; 438/620; 257/296; 257/298; 257/779; 257/E21.585; 257/E21.507; 257/E21.657

(58) Field of Classification Search ................. 438/597, 438/598, 605, 620; 257/296, 298, 779, E21.585, 257/E21.507, E21.657
See application file for complete search history.

(56) References Cited

U.S. PATENT DOCUMENTS

| 2002/0058379 | A1 | 5/2002 | Sano | |
| 2004/0149992 | A1* | 8/2004 | Park et al. | ...................... 257/71 |
| 2006/0261392 | A1* | 11/2006 | Lee et al. | ..................... 257/296 |

* cited by examiner

*Primary Examiner*—Michael S. Lebentritt
*Assistant Examiner*—Mohsen Ahmadi
(74) *Attorney, Agent, or Firm*—Townsend and Townsend and Crew LLP (57) ABSTRACT

A method for manufacturing a semiconductor device includes forming a second storage node contact hole with a mask for storage node and securing an overlay margin between a storage node contact hole and a storage node with a hard mask layer that serves as a hard mask as well as an anti-reflection film to reduce contact resistance, prevent reduction of a line-width of a lower interlayer insulating film and eliminate processes for depositing the interlayer insulating film and a polysilicon layer and etching the polysilicon layer to reduce a production period and cost of products.

17 Claims, 7 Drawing Sheets

METHOD FOR MANUFACTURING SEMICONDUCTOR DEVICE

CROSS-REFERENCES TO RELATED APPLICATIONS

The present application claims priority to Korean patent application number 10-2006-0001788, filed on Jan. 1, 2006, which is incorporated by reference in its entirety.

BACKGROUND OF THE INVENTION

The present invention relates to a method for manufacturing a semiconductor device, and more specifically, to a method for obtaining an overlay margin between a storage node contact plug and a storage node using a multi functional hard mask layer that serves as a hard mask as well as an anti-reflection film.

Currently, a bottom anti-reflection coating (BARC) film, which is coated by a spin-on system, contains a material that absorbs light in a particular wavelength band of an exposure light source. The BARC film is applied before a photoresist film is coated for a patterning process with KrF.

The BARC film prevents scattered reflection from beneath the photoresist film and eliminates standing waves inside the thickness of the photoresist film. This increases the uniformity of the photoresist film. However, since the BARC film does not serve as a hard mask layer, researches have been forced to develop cross-linking agents and polymers for anti-reflection films to more easily remove the BARC film.

As devices become smaller, the thickness of the photoresist film has become thinner to prevent the collapse of patterns and obtain exposure latitude (EL) and depth of focus (DOF) so that the photoresist film does not serve as an etching barrier. When an amorphous carbon layer is used as a hard mask, it requires additional processes for forming a photoresist film, an anti-reflection film, and a silicon oxide nitride film.

BRIEF SUMMARY OF THE INVENTION

Various embodiments of the present invention are directed at providing a method for manufacturing a semiconductor device which includes forming a storage node contact hole (also referred to as "second storage node contact hole") and a storage node contact with a multi functional hard mask layer that serves as a hard mask as well as an anti-reflection film.

According to an embodiment of the present invention, a method for manufacturing a semiconductor device includes the steps of: forming an interlayer insulating film over a semiconductor substrate including a gate and a bit line; selectively etching the interlayer insulating film to form a first interlayer insulating film pattern having a height of 'a' using a contact mask for a storage node; forming a hard mask layer over the resulting structure including the first interlayer insulating film pattern; forming a photoresist pattern over the multi functional hard mask layer using the contact mask for a storage node; selectively etching the multi functional hard mask layer and the first interlayer insulating film pattern, the first interlayer insulating film pattern is etched away by the thickness of 'b' from the top surface ($0 \leq b < a$); removing the photoresist pattern and the hard mask layer to form a second interlayer insulating film pattern; forming a spacer on the sidewall of the second interlayer insulating film pattern; forming a polysilicon layer over the resultant; and planarizing the polysilicon layer.

In one embodiment, a method for manufacturing a semiconductor device includes forming an insulating layer over a semiconductor substrate including a gate and a bit line; etching the insulating layer to form a first insulating pattern having a first height; forming a mask layer over the first insulating pattern, the mask layer configured to be an etch stop layer and an anti-reflective layer; forming a mask pattern over the mask layer; etching the hard mask layer and the first insulating pattern, so that the first insulating pattern is provided with a step, thereby defining a second insulating film pattern; removing the mask pattern and the mask layer, so that the second insulating pattern defines a thorough hole; and forming a contact plug within the thorough hole.

In another embodiment, a method for manufacturing a semiconductor device includes forming an insulating film over a semiconductor substrate including a gate and a bit line and etching the insulating film to form a first insulating film pattern having a height of using a contact mask for a storage node. The method further includes forming a hard mask layer over a resulting structure including the first insulating film pattern, the hard mask layer being configured to be an etch stop layer and an anti-reflective layer; forming a photoresist pattern over the multi functional hard mask layer using the contact mask for the storage node; etching the hard mask layer and the first insulating film pattern, the first insulating film pattern to have a step, thereby defining a second insulating film pattern; removing the photoresist pattern and the m hard mask layer to expose the second insulating film pattern, the second insulating film pattern defining a thorough hole that exposes the bit line; forming a spacer on a sidewall of the second insulating film pattern; and forming a storage node contact plug within the thorough hole.

DESCRIPTION OF THE EMBODIMENT

The present invention will be described in detail with reference to the accompanying drawings.

Figure 1A:
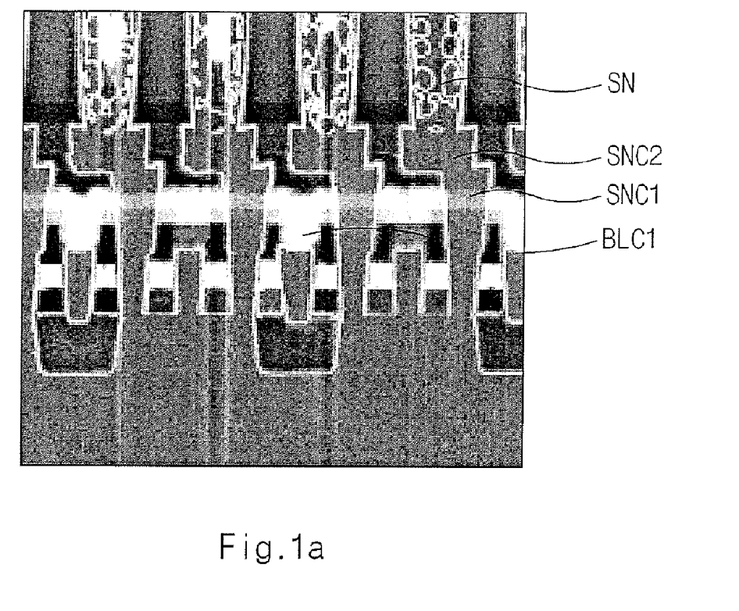
FIGS. 1a and 1b are photographs illustrating a conventional semiconductor device.
Figure 1B:
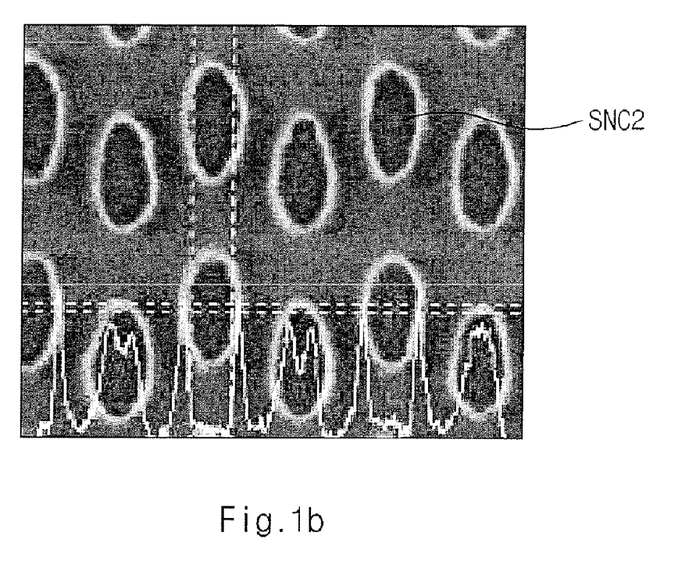

FIGS. 1a and 1b are photographs illustrating a conventional semiconductor device.

As the design rule for semiconductor devices decreases, the overlay margin between a storage node region (e.g., a capacitor) and a storage node contact region (e.g., a region for connecting a landing plug and a storage node to a lower part of a storage node of a cell area) is not sufficient to prevent an increase in contact resistance. As a result, an additional process for forming a storage node contact (hereinafter, referred to as "second storage node contact") has been used to improve the overlay margin.

A first storage node contact, a second storage node contact, and a storage node are formed over a semiconductor substrate having given structures, e.g., a bit line and a gate. As shown in FIG. 1b, the second storage node contact causes mask error factors that generate a difference between the pattern designed over the mask and the pattern formed after the exposure process because the second storage electrode contact is formed to be zigzag.

Moreover, processes for depositing an interlayer insulating film, etching the second storage node contact mask and the interlayer insulating film, forming a polysilicon layer, and blanket-etching the polysilicon layer are required, which increases the production time and cost.

FIGS. 2a through 2d are cross-sectional diagrams illustrating a conventional method for manufacturing a semiconductor device.

Figure 2A:
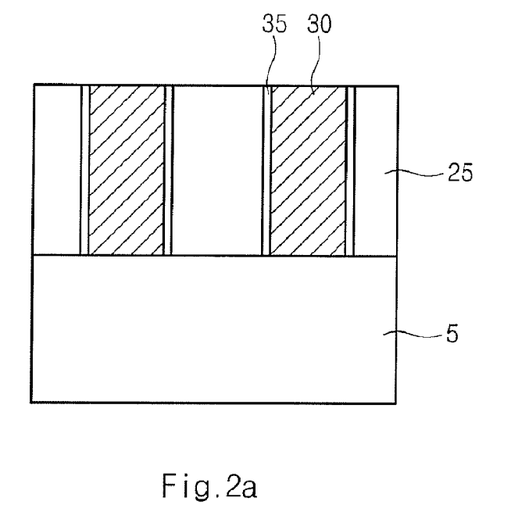
FIGS. 2a through 2d are cross-sectional diagrams illustrating a conventional method for manufacturing a semiconductor device.

A semiconductor substrate 5 includes a gate (not shown), a bit line hard mask layer (not shown) and a bit line (not shown). A first interlayer insulating film 25 is formed over the semiconductor substrate 5. The first interlayer insulating film 25 is etched to form a first storage node contact hole (not shown). A spacer 35 is formed on the sidewall of the first storage node contact hole. The first storage node contact hole is then filled with a polysilicon layer to form a first storage node contact (SNC) plug 30.

Figure 2B:
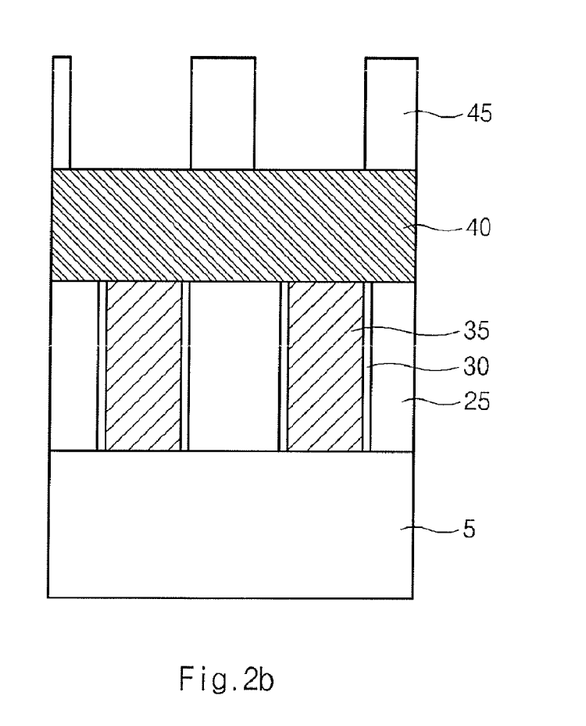

A second interlayer insulating film 40 is formed over the resulting structure (FIG. 2b). A photoresist pattern 45 for defining the second storage node contact (SNC2) is formed over the second interlayer insulating film 40.

Figure 2C:
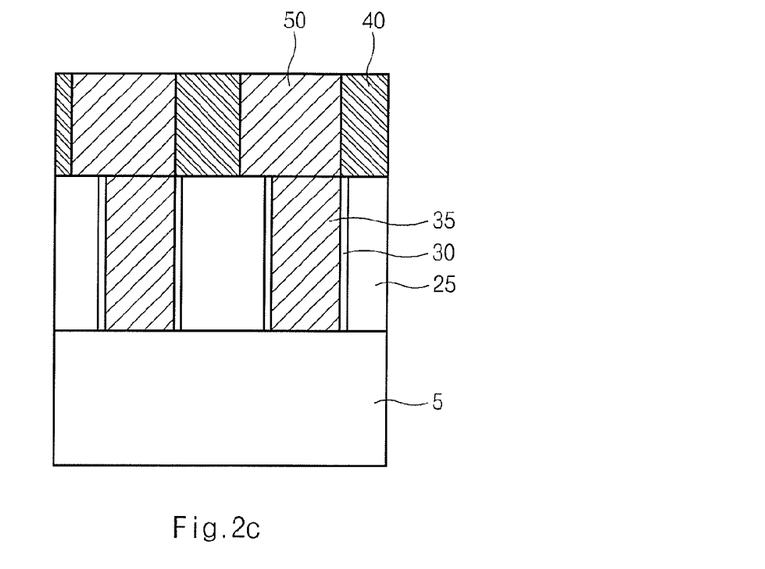

The second interlayer insulating film 40 is etched using the photoresist pattern 45 as an etching mask to form a second storage node contact hole (not shown). The second storage node contact hole is filled with a polysilicon layer, and planarized to form a second storage node contact (SNC2) plug 50 (FIG. 2c).

Figure 2D:
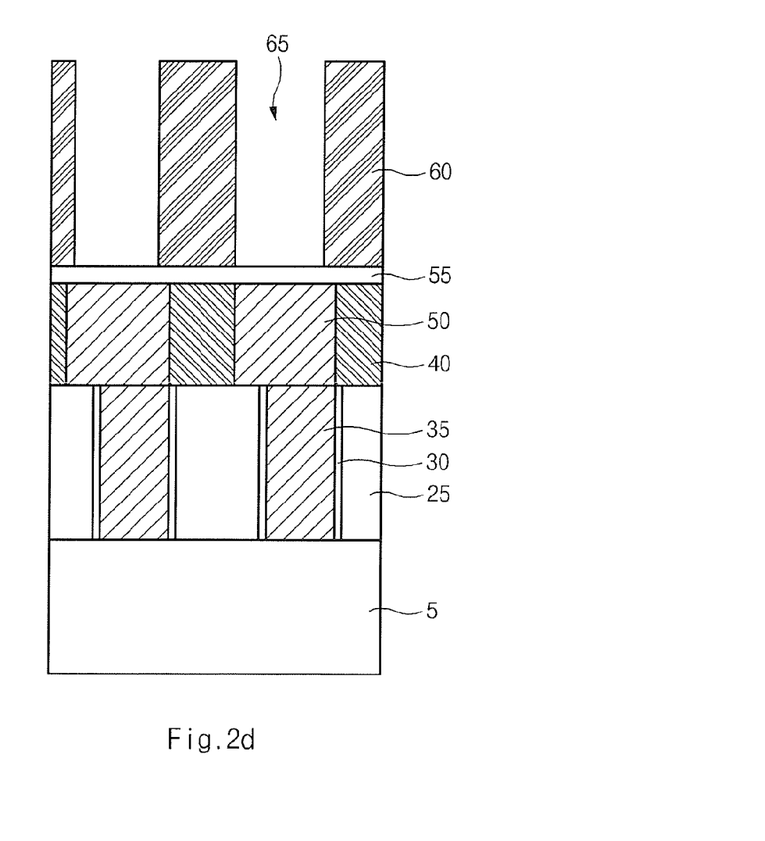

An etching barrier film (or etch stop layer) 55 and an oxide film 60 for a storage node are formed over the resulting structure. The oxide film 60 is etched to obtain a storage node region 65 (FIG. 2d).

In the method described above, the second storage node contact (SNC2) is required to be overlapped with the first storage node contact (SNC) having a wider line-width than that of the first storage node contact (SNC) in order to obtain an overlay margin between the first storage node contact (SNC) and the storage node (SN). When a pattern that defines the second storage node contact (SNC2) is formed, a misarrangement is generated.

FIGS. 3a through 3e are cross-sectional diagrams illustrating a method for manufacturing a semiconductor device according to an embodiment of the present invention.

Figure 3A:
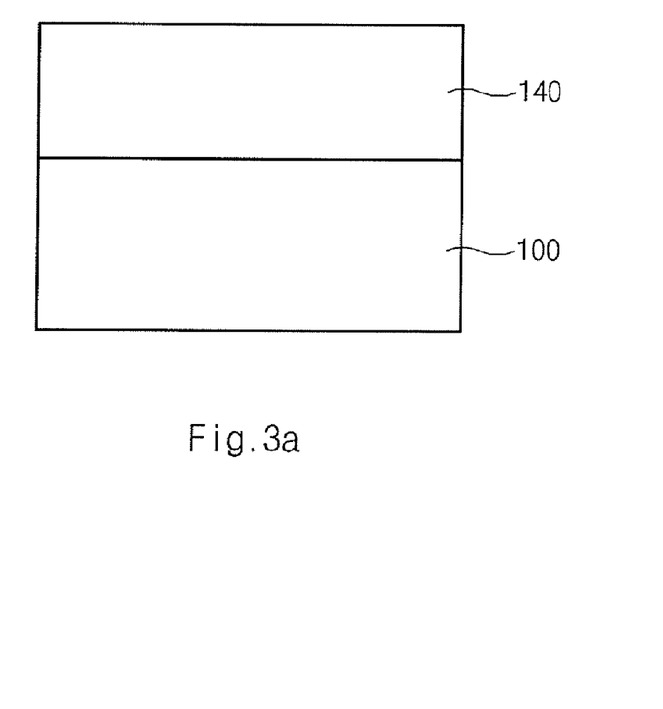
FIGS. 3a through 3e are cross-sectional diagrams illustrating a method for manufacturing a semiconductor device according to an embodiment of the present invention.

A semiconductor substrate 100 includes a gate (not shown), a bit line hard mask layer (not shown) and a bit line (not shown) (FIG. 3a). A interlayer insulating film 140 is formed over the semiconductor substrate 100. The interlayer insulating film 140 is formed of an oxide film and has a thickness ranging from about 2000 to 4000 Å. This is about 1000 to 2000 Å thicker than the conventional film.

Figure 3B:
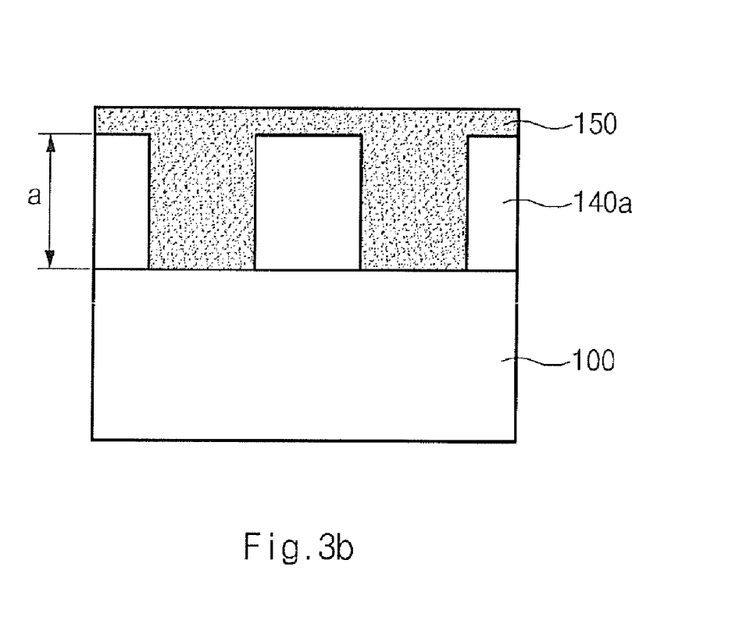

The interlayer insulating film 140 is selectively etched to form a first interlayer insulating film pattern 140a having a height 'a' (FIG. 3b). The contact mask used in the photolithography process is the same contact mask as will be used for the storage node in the present implementation. A multi functional hard mask layer 150 is formed over the semiconductor substrate 100 including the first interlayer insulating film pattern 140a. The first interlayer insulating film pattern 140a defines the first storage node contact hole (not shown).

The multi functional hard mask layer 150 has a refractive index (n) ranging from about 1.0 to about 1.8, and an absorptivity (k) ranging from about 0.4 to about 0.7. The multi functional hard mask layer 150 is formed of polymer which includes C, H and O with silicon of 20~40 wt %. The multi functional hard mask layer 150 serves as both a hard mask layer and an anti-reflection film for increasing the etching selectivity when etching lower layers. The multifunctional hard mask layer 150 is also configured to absorb light, e.g., in the ArF wavelength of 193 nm for improving the uniformity of the patterns. The hard mask layer 150 is coated by a spin-on method in a track used in patterning during an exposure process by a spin-on system to reduce production cost as compared to a hard mask layer formed by a chemical vapor deposition (CVD) system. Also, the multi functional hard mask layer 150 has a thickness ranging from about 500 to 700 Å measured from the top surface of the first interlayer insulating film pattern 140a. That is, an upper surface of the hard mask layer 150 is provided to be 500 to 700 Å above an upper surface of the first interlayer insulating film pattern 140a. Unlike general photoresist films and anti-reflection films, the multi functional hard mask layer 150 has excellent planarizing properties.

Figure 3C:
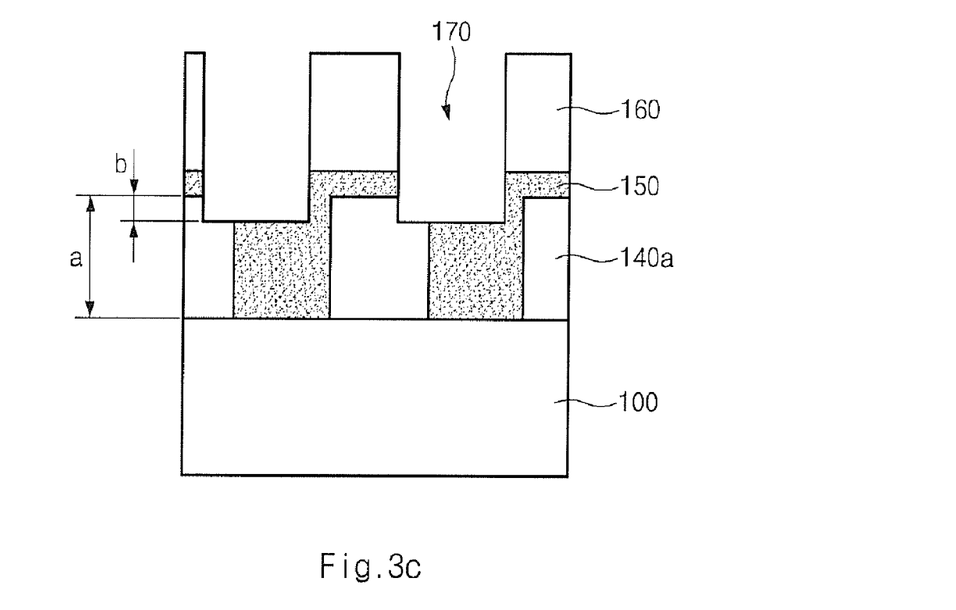

A photoresist pattern 160 for defining a second storage node contact hole 170 is formed over the multi functional hard mask layer 150 (FIG. 3c). The reflectivity of the multi functional hard mask layer 150 can be adjusted so that the photoresist pattern 160 can be formed without an anti-reflection film. An exposure process for forming the photoresist pattern 160 is performed using the same contact mask as will be used for the storage node. The photoresist pattern 160 is over-exposed so that the second storage node contact hole 170 has a larger line-width than the critical value of the mask for the storage node (SN). The lower part of the storage node (SN) is aligned with a second storage node contact (SNC2) plug to obtain accuracy between the second storage node contact holes (SNC2) plug, thereby preventing overlapping of the first storage node contact (SNC) plug and the second storage node contact (SNC2) plug. The multi functional hard mask layer 150 and a first interlayer insulating film pattern 140a are selectively etched using the photoresist pattern 160 as an etching mask. The thickness of the etched first interlayer insulating film pattern 140a is 'b', where 'b' is 20~50% of height 'a' (0<b<a). The thickness 'b' etched is measured from the top surface of the first interlayer insulating film pattern 140a.

The multi functional hard mask layer 150 is etched with an etching gas selected from the group consisting of $CF_4$, $O_2$ and a combination thereof. Since the etching selectivity of the multi functional hard mask layer 150 and the photoresist pattern 160 ranges from about 1.0 to 1.3, the multi functional hard mask layer 150 is etched by less than 1000 Å using the photoresist pattern 160 as an etching mask. The first interlayer insulating film pattern 140a is etched with an etching gas selected from the group consisting of $C_4F_6$, $O_2$, Ar and combinations thereof to a thickness ranging from about 1000 to about 2000 Å so that a nitride film 120 which is a bit line hard mask layer is not damaged.

Figure 3D:
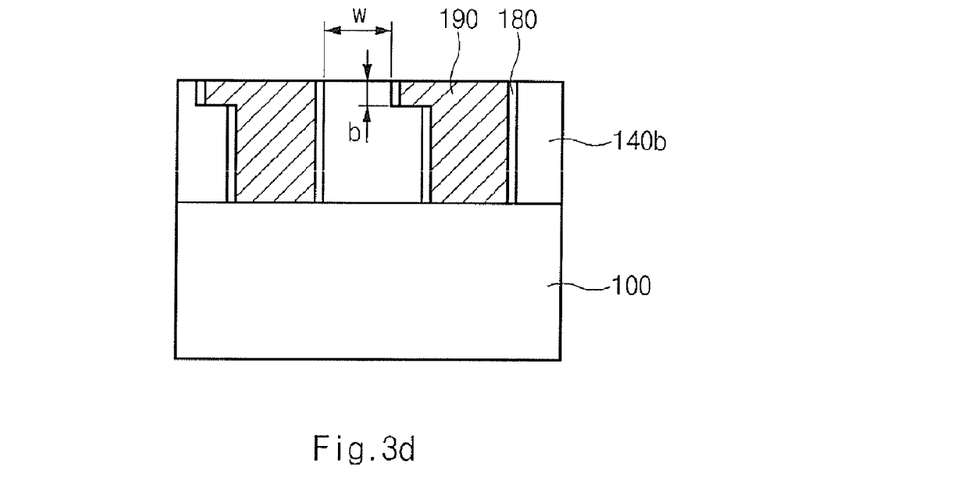

The etching of the photoresist pattern 160 and the first interlayer insulating film pattern 140a results in a second interlayer insulating film pattern 140b is obtained (FIG. 3d). The second interlayer insulating film pattern 140b has a step having a width of 'w' and a height of 'b', so that the upper portion of the first interlayer insulating film pattern 140a is narrower than the lower portion.

The photoresist pattern 160 and the multi functional hard mask layer 150 are removed. In one embodiment, the photoresist pattern 160 is removed by ashing, e.g., using $O_2$ plasma. A wet etching process then removes the multi functional hard mask layer 150. The wet etching process is performed with one selected from the group consisting of fluorine, alkaline, and combinations thereof.

A spacer 180 is formed on the sidewall of the second interlayer insulating film pattern 140b. A polysilicon layer (not shown) is formed over the surface of the resultant. The polysilicon layer is polished until the second interlayer insulating film pattern 140b is exposed to form a storage node contact plug 190.

The spacer 180 is deposited to prevent a short between the bit line 130 and first and second storage node contact holes (not shown). In addition, after a polysilicon layer is formed to fill the first and second storage node contact holes (not shown), a blanket etching process is performed to obtain a storage node contact plug 190.

Figure 3E:
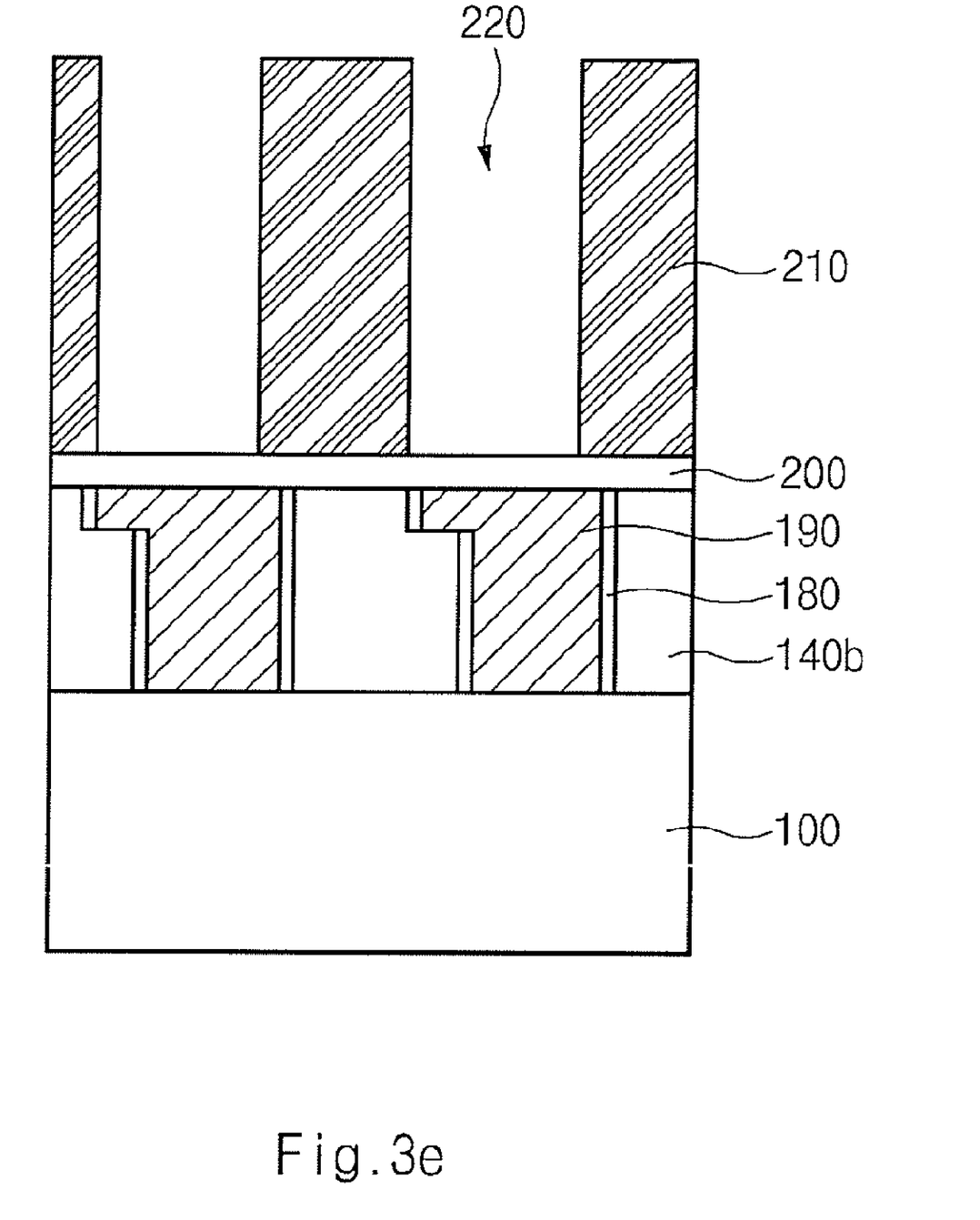

An etching barrier film (or etch stop layer) 200 and an oxide film 210 are formed and etched to obtain a storage node region 220 (FIG. 3e). The etching barrier film 200 includes a nitride film, and serves as an etch stop when the oxide film 210.

Figure 4:
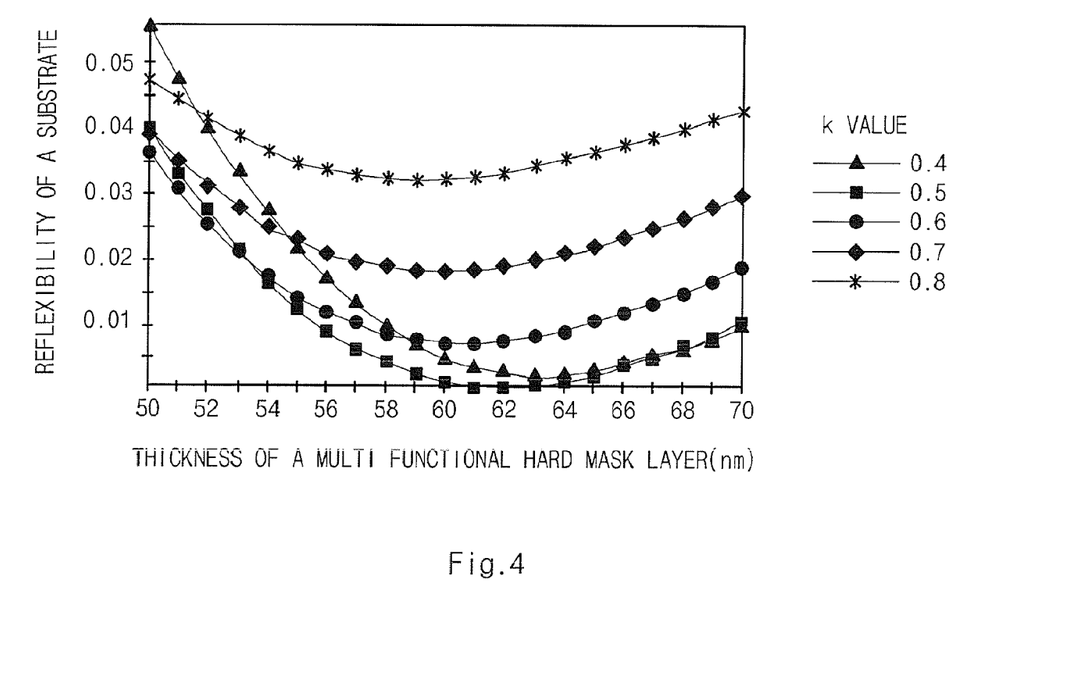
FIG. 4 is a graph illustrating reflexibility of a substrate depending on thickness of a multi functional hard mask layer for several k values, where k is absorptivity.

FIG. 4 is a graph illustrating reflexibility of a substrate depending on the k value and the thickness of a multi functional hard mask layer. As the hard mask layer becomes thicker, the reflexibility of the substrate is reduced. As the k value becomes larger, the reflexibility of the substrate is increased.

As described above, according to an embodiment of the present invention, an overlay margin between a storage node contact hole and a storage node is obtained by a multi functional hard mask layer that serves as a hard mask as well as an anti-reflection film. This reduces contact resistance, preventing the reduction of the line-width of a lower interlayer insulating film. This also omits the processes for depositing the interlayer insulating film and the polysilicon layer and etching the polysilicon layer, reducing the production time and production cost.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming an insulating film over a semiconductor substrate including a gate and a bit line;
    etching the insulating film to form a first insulating film pattern having a height of using a contact mask for a storage node;
    forming a hard mask layer over a resulting structure including the first insulating film pattern, the hard mask layer being configured to be an etch stop layer and an anti-reflective layer;
    forming a photoresist pattern over the hard mask layer using the contact mask for the storage node;
    etching the hard mask layer and the first insulating film pattern, the first insulating film pattern to have a step, thereby defining a second insulating film pattern;
    removing the photoresist pattern and the hard mask layer to expose the second insulating film pattern, the second insulating film pattern defining a thorough hole that exposes the bit line;
    forming a spacer on a sidewall of the second insulating film pattern; and
    forming a storage node contact plug within the thorough hole.

2. The method according to claim 1, wherein the insulating film includes oxide, the storage node contact plug includes polysilicon.

3. The method according to claim 1, wherein the insulating film has a thickness ranging from 2000 Å to 4000 Å

4. The method according to claim 1, wherein the hard mask layer is a multi functional hard mask layer that includes silicon.

5. The method according to claim 1, wherein the hard mask layer has a refractive index ranging from 1.0 to 1.8, and an absorptivity ranging from 0.4 to 0.7.

6. The method according to claim 1, wherein the hard mask layer is formed to have a thickness ranging from 500 Å to 700 Å from the top of the insulating film.

7. The method according to claim 1, wherein the etching-the-hard-mask-layer step is performed with an etching gas selected from the group consisting of $CF_4$, $O_2$ and a combination thereof.

8. The method according to claim 1, wherein the etching-a-first-insulating-film step is performed with an etching gas selected from the group consisting of $C_4F_6$, $O_2$, Ar and combinations thereof.

9. The method according to claim 1, wherein a height of the step of the first insulating film pattern is 20~50% of the height of the first insulating film pattern.

10. The method according to claim 1, wherein the removing-the-hard-mask-layer step is performed by a wet process using one selected from the group consisting of fluorine, alkaline and a combination thereof.

11. The method according to claim 1, wherein the first insulating film pattern is formed to have a line-width ranging from 5 nm to 20 nm.

12. A method for manufacturing a semiconductor device, the method comprising:
    forming an insulating layer over a semiconductor substrate including a gate and a bit line;
    etching the insulating layer to form a first insulating pattern having a first height;
    forming a mask layer over the first insulating pattern, the mask layer configured to be an etch stop layer and an anti-reflective layer;
    forming a mask pattern over the mask layer;
    etching the hard mask layer and the first insulating pattern, so that the first insulating pattern is provided with a step, thereby defining a second insulating film pattern;
    removing the mask pattern and the mask layer, so that the second insulating pattern defines a thorough hole; and
    forming a contact plug within the thorough hole.

13. The method of claim 12, wherein the first insulating pattern is formed by using a contact mask for a storage node.

14. The method of claim 13, wherein the mask pattern is defined using the contact mask for the storage node.

15. The method of claim 13, further comprising:
    forming a spacer on a sidewall of the second insulating pattern.

16. The method of claim 15, wherein the thorough hole exposes the bit line, and the contact plug contacts the bit line via the thorough hole.

17. The method of claim 13, wherein the mask pattern is a photoresist pattern, and the contact plug is a storage node contact plug that contacts the bit line.

* * * * *